(12) United States Patent
Tsai et al.

(10) Patent No.: US 7,916,062 B2
(45) Date of Patent: Mar. 29, 2011

(54) PIN-SHARING ANALOG FRONT-END PROCESSING APPARATUS AND METHOD FOR PIN-SHARING THEREOF

(75) Inventors: Jui-Yuan Tsai, Tai-Nan (TW);
Cheng-Jui Chen, Tao-Yuan Hsien (TW)

(73) Assignee: Realtek Semiconductor Corp.,
HsinChu (TW)

( * ) Notice: Subject to any disclaimer, the term of this patent is extended or adjusted under 35 U.S.C. 154(b) by 0 days.

(21) Appl. No.: 12/561,266

(22) Filed: Sep. 17, 2009

(65) Prior Publication Data
US 2010/0066428 A1 Mar. 18, 2010

(30) Foreign Application Priority Data
Sep. 17, 2008 (TW) ................................ 97135616 A

(51) Int. Cl.
*H03M 1/12* (2006.01)
(52) U.S. Cl. ........... 341/155; 341/122; 348/257; 345/87
(58) Field of Classification Search .................. 341/122, 341/126, 155, 156; 348/254; 345/87
See application file for complete search history.

(56) References Cited

U.S. PATENT DOCUMENTS 5,426,461 A * 6/1995 Ohara ............................ 348/254
2004/0207586 A1 * 10/2004 Tsai et al. ........................ 345/87

* cited by examiner

*Primary Examiner* — Jean B Jeanglaude
(74) *Attorney, Agent, or Firm* — Winston Hsu; Scott Margo

(57) ABSTRACT

An analog front-end processing apparatus capable of sharing pins includes a plurality of positive pins, a negative pin, a plurality of positive clamping circuits, a negative clamping circuit, a plurality of sample and hold circuits and a plurality of adjusting circuits. The positive clamping circuits have positive signals fixed at their corresponding target positive voltages. The negative clamping circuit has a negative signal fixed at a first reference voltage. Each sample and hold circuit has a positive input terminal and a negative input terminal, wherein a voltage difference between the two input terminals is substantially equal to a voltage difference between the corresponding target positive voltage and the first reference voltage during a sample period, and a voltage difference between the two input terminals is equal to a voltage difference between the corresponding target negative voltage and a second reference voltage during a hold period.

16 Claims, 4 Drawing Sheets

US 7,916,062 B2

PIN-SHARING ANALOG FRONT-END PROCESSING APPARATUS AND METHOD FOR PIN-SHARING THEREOF

BACKGROUND OF THE INVENTION

1. Field of the Invention

The present invention relates to an analog front-end processing apparatus and a related method for pin-sharing, and more particularly, to an analog front-end processing apparatus and a related method for having all negative signals fixed at a reference voltage and improving its internal sample and hold circuits.

2. Description of the Prior Art

Display system chips, such as televisions and liquid crystal display (LCD) screens, usually have an analog front-end circuit for converting analog signals (such as R, G, and B) into digital signals for displaying images. In practice, the analog signals are usually single-ended signals. But for noise considerations, the display system chip will adopt differential signals in signal processing, and thus the received single-ended signals must be converted into differential signals within the chip. Because the DC level of each signal is different from each other, AC-coupling techniques are used to input AC components of the signals into the display system chip. And then the DC level of each signal is redistributed after AC coupling capacitors.

Common approach of the DC level redistribution, taking the DC level redistribution of image signals as an example, is that firstly fix the DC levels of positive signals (such as R+, G+, and B+) of differential signals at their corresponding target positive voltages, and then fine-tune the DC levels of negative signals (such as R−, G−, and B−) of the differential signals to their corresponding target negative voltages to therefore determine the DC levels of the differential signals. Due to the signal range of each positive signal being different, the target negative voltage of each channel would be different. As a result, the negative pins of the negative signals cannot be shared, and the number of the negative pins is equal to the number of the positive signals, which is not economic in consideration of cost.

SUMMARY OF THE INVENTION

It is therefore one of the objectives of the present invention to provide an analog front-end processing apparatus for pin-sharing and a related method to solve the abovementioned problems.

According to an exemplary embodiment of the present invention, an analog front-end processing apparatus capable of sharing pins is provided. The analog front-end processing apparatus receives all positive signals and one negative signal of a plurality of pairs of differential signals. The analog front-end processing apparatus includes a plurality of positive pins, a negative pin, a plurality of positive clamping circuits, a negative clamping circuit, a plurality of sample and hold circuits, and a plurality of adjusting circuits. The plurality of positive pins is respectively used for receiving the positive signals of the plurality of pairs of differential signals. The negative pin is used for receiving the negative signal of a designated pair of the plurality of pairs of differential signals. The plurality of positive clamping circuits are respectively coupled to the plurality of positive pins for having DC levels of the positive signals fixed at their corresponding target positive voltages. The negative clamping circuit is coupled to the negative pin for having a DC level of the negative signal fixed at a first reference voltage. Each sample and hold circuit has a positive input terminal and a negative input terminal, wherein a voltage difference between the two input terminals of each sample and hold circuit is substantially equal to a voltage difference between the corresponding target positive voltage and the first reference voltage during a sample period, and a voltage difference between the two input terminals of each sample and hold circuit is equal to a voltage difference between a corresponding target negative voltage and a second reference voltage during a hold period. The plurality of adjusting circuits are respectively coupled to the plurality of sample and hold circuits for respectively adjusting the plurality of sample and hold circuits to their corresponding target negative voltages. The first reference voltage is substantially different from or equal to the second reference voltage.

According to an exemplary embodiment of the present invention, a method for sharing pins of an analog front-end processing apparatus is provided. The method includes the steps of receiving all positive signals of a plurality of pairs of differential signals; receiving one negative signal of a designated pair of the plurality of pairs of differential signals; respectively having DC levels of the positive signals fixed at their corresponding target positive voltages; having a DC level of the negative signal fixed at a first reference voltage; providing a plurality of sample and hold circuits each having a positive input terminal and a negative input terminal; coupling the positive input terminal of each sample and hold circuit to the corresponding target positive voltage, and coupling the negative input terminal of each sample and hold circuit to the first reference voltage during a sample period; coupling the positive input terminal of each sample and hold circuit to the corresponding target negative voltage, and coupling the negative input terminal of each sample and hold circuit to a second reference voltage during a hold period; and respectively adjusting the plurality of sample and hold circuits to their corresponding target negative voltages.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
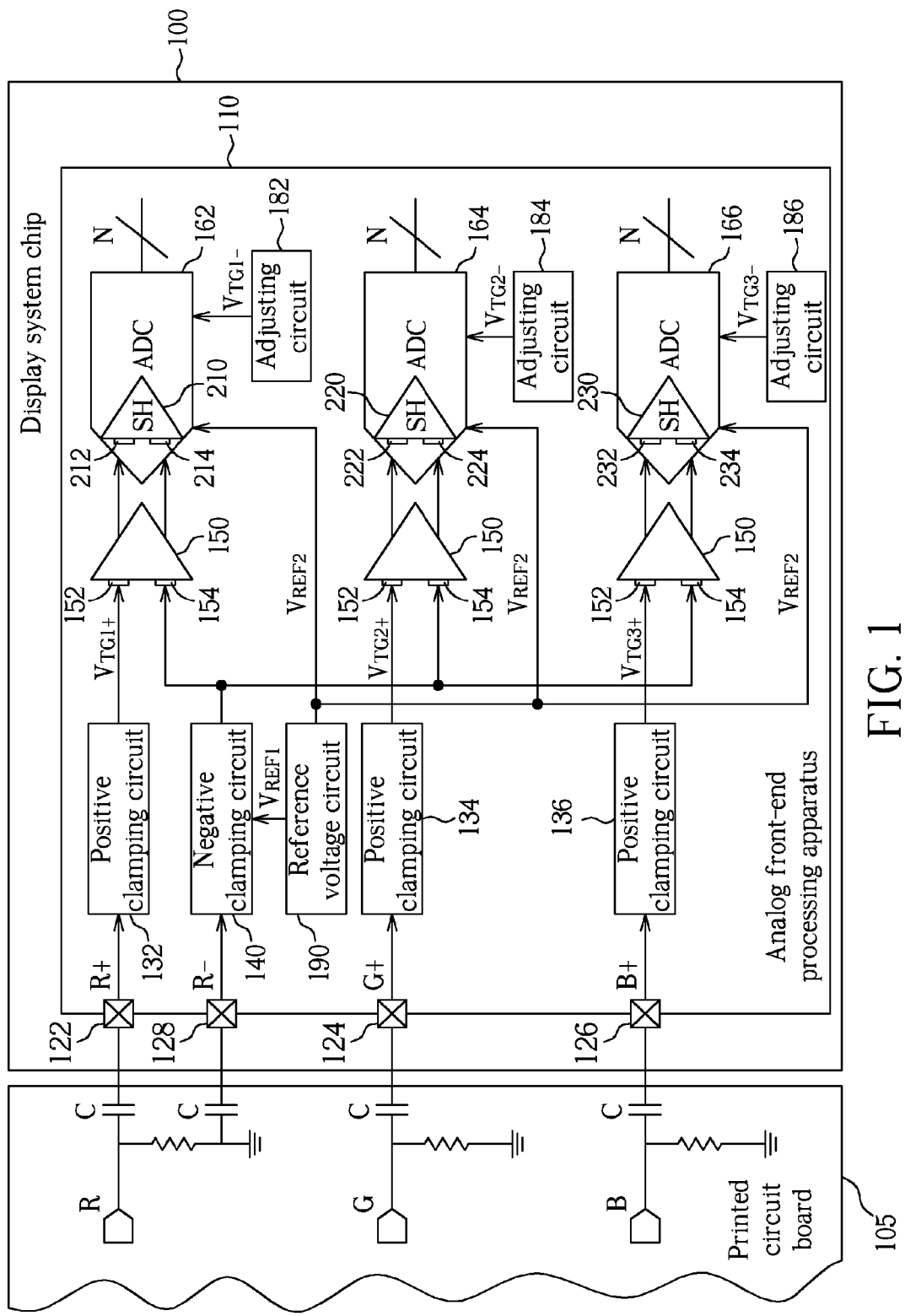
FIG. 1 is a diagram of an analog front-end processing apparatus capable of sharing pins according to an embodiment of the present invention.

Please refer to FIG. 1. FIG. 1 is a diagram of an analog front-end processing apparatus 110 applied to a display system according to an embodiment of the present invention. Its DC level redistributing mechanism can be applied to various kinds of differential signals, wherein the differential signals of a display system is merely one of the embodiments. The analog front-end processing apparatus 110 can be disposed within a display system chip 100. The display system chip 100 receives a plurality of pairs of image differential signals R, B, and B, wherein the AC components of the signals are inputted from a printed circuit board 105 into the display system chip 100 through AC coupling capacitors C. Each pair of image differential signals respectively includes a positive signal (i.e., R+, G+, and B+) and a negative signal (i.e., R−, G−, and B−). The analog front-end processing apparatus 110 is provided with a plurality of positive pins 122, 124, and 126 respectively used for receiving the plurality of positive signals R+, G+, and B+ among the plurality of pairs of image differential signals, and a negative pin 128 for receiving a negative signal (such as R−) of a designated pair among the plurality of pairs of image differential signals.

The analog front-end processing apparatus 100 includes, but is not limited to, a plurality of positive clamping circuits 132~136, a negative clamping circuit 140, a plurality of input buffers 150, a plurality of analog-to-digital converters 162~166, a plurality of sample and hold circuits 210~230, a plurality of adjusting circuits 182~186, and a reference voltage circuit 190. The reference voltage circuit 190 is coupled to the negative clamping circuit 140 and the plurality of sample and hold circuits 210~230 for providing a first reference voltage $V_{REF1}$ to the negative clamping circuit 140 and for providing a second reference voltage $V_{REF2}$ to the plurality of sample and hold circuits 210~230. The plurality of positive clamping circuits 132~136 are respectively coupled to the plurality of positive pins 122~126 for respectively having DC levels of the positive signals R+, G+, and B+ fixed at their corresponding target positive voltages. For example, the positive signal R+ is fixed at a first target positive voltage $V_{TG1+}$, the positive signal G+ is fixed at a second target positive voltage $V_{TG2+}$, and the positive signal B+ is fixed at a third target positive voltage $V_{TG3+}$. The negative clamping circuit 140 is coupled to the negative pin 128 for having DC level of the negative signal R− of the designated pair of image differential signals fixed at the first reference voltage $V_{REF1}$. The positive signals R+, G+, and B+ of each pair of image differential signals are inputted to positive input terminals 152 of their corresponding input buffers 150, and the negative signal R− of the designated pair of image differential signals is inputted to negative input terminals 154 of all input buffers 150.

The plurality of sample and hold circuits 210~230 are respectively disposed within their corresponding analog-to-digital converters 162~166. Each sample and hold circuit (210~230) respectively has a positive input terminal (212~232) and a negative input terminal (214~234). During a sample period, a voltage difference between the two input terminals of each sample and hold circuit 210~230 is substantially equal to a voltage difference between the corresponding target positive voltage (i.e., $V_{TG1+}$, $V_{TG2+}$, and $V_{TG3+}$) and the first reference voltage $V_{REF1}$. During a hold period, a voltage difference between the two input terminals of each sample and hold circuit 210~230 is equal to a voltage difference between the corresponding target negative voltage (i.e., $V_{TG1-}$, $V_{TG2-}$, and $V_{TG3-}$) and the second reference voltage $V_{REF2}$. The sample and hold circuit 210 is cited as an example, during the sample period, the positive input terminal 212 receives the positive signal R+ fixed at the first target positive voltage $V_{TG1+}$ and the negative input terminal 214 receives the negative signal R− fixed at the first reference voltage $V_{REF1}$, wherein the voltage difference between them is equal to $(W_{TG1+}-V_{REF1})$. During the hold period, the positive input terminal 212 receives the signal fixed at the first target negative voltage $V_{TG1-}$ and the negative input terminal 214 receives the signal fixed at the second reference voltage $V_{REF2}$, wherein the voltage difference between them is equal to $(V_{TG1-}-V_{REF2})$. The plurality of adjusting circuits 182~186 are respectively coupled to the plurality of sample and hold circuits 210~230 for respectively adjusting the plurality of sample and hold circuits 210~230 to their corresponding target negative voltages $V_{TG1-}$~$V_{TG3-}$. Finally, the plurality of image differential signals R, G, and B are transformed into digital format by using their own analog-to-digital converters 162~166 themselves.

Please note that the abovementioned first reference voltage $V_{REF1}$ can be substantially equal to the second reference voltage $V_{REF2}$. Thus, during the sample period, the signal sampled by the sample and hold circuit 210 is the voltage difference $(V_{TG1+}-V_{REF1})$ between the corresponding target positive voltage and the first reference voltage; and during the hold period, the signal outputted by the sample and hold circuit 210 is the voltage difference $(V_{TG1+}-V_{TG1-})$ between the corresponding target positive voltage and the corresponding target negative voltage. As can be known from the equation below:

$$V_{op} - V_{on} = (V_{TG1+} - V_{REF1}) - (V_{TG1} - V_{REF1}) \qquad (1)$$
$$= (V_{TG1+} - V_{TG1-})$$

The abovementioned embodiment is merely an example for illustrating features of the present invention and should not be seen as limitations of the present invention. In other embodiments, the first reference voltage $V_{REF1}$ and the second reference voltage $V_{REF2}$ with different values can be adopted to implement the analog front-end processing apparatus disclosed in the present invention, and this should also belong to the scope of the present invention. Thus, during the hold period, the signals outputted by the sample and hold circuits 210~230 only exist a voltage offset $(V_{REF2}-V_{REF1})$, which can be easily eliminated by using DC level shift.

As can be known from FIG. 1, the three image differential signals of the analog front-end processing apparatus 110 can share the same negative pin 128. In the embodiment above, the image differential signals R, G, and B are cited as an example. But those skilled in the art should know that this should not be limitations of the present invention, and the present invention can be applied to image signals of other formats, such Y, Pb, and Pr. In addition, the number of image differential signals is no limited. For example, if totally N pairs of image differential signals are included, only (N+1) pins (including N positive pins and one negative pin) are required in the DC level redistributing mechanism disclosed in the present invention.

Please note that the abovementioned embodiment is merely an example for describing the present invention, and in no way should be considered to be limitations of the scope of the present invention. In other embodiments, the image differential signals G or B can be adopted as the designated pair of image differential signals. It will be obvious to those skilled in the art that various modifications of the designated pair of image differential signals may be made without departing from the spirit of the present invention. Furthermore, the display system chip 100 can be a television or an LCD monitor. But this should not be a limitation of the present invention, and can be display system chips of other types as well.

Figure 2:
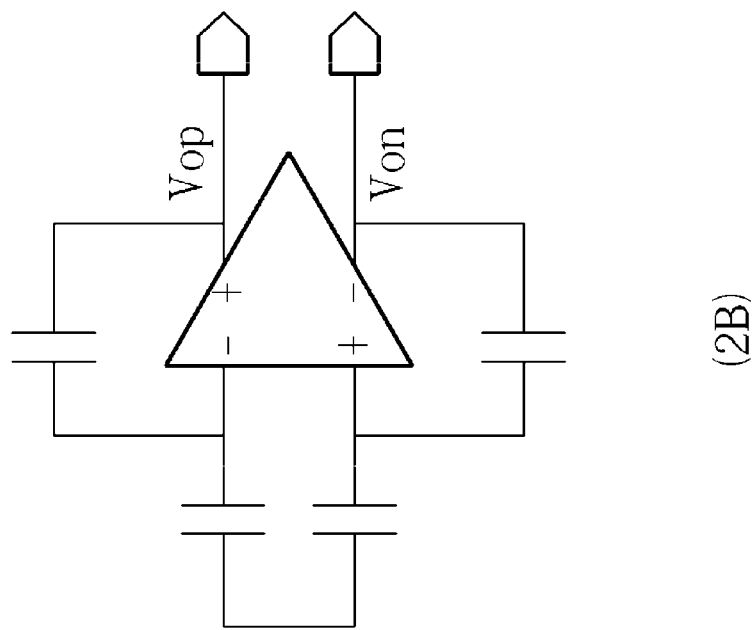
FIG. 2 (including 2A and 2B) is a diagram showing the traditional sample and hold circuit during a sample period and during a hold period.
Figure 2:
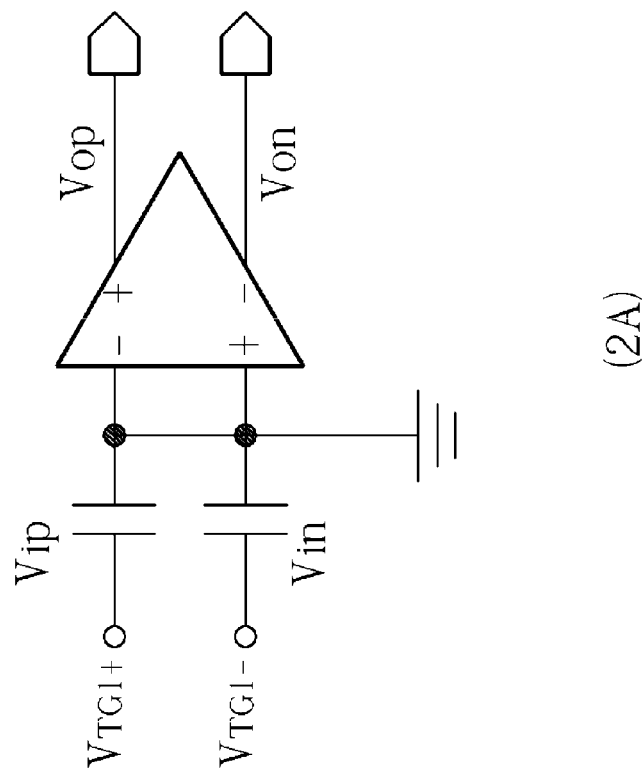
Figure 3:
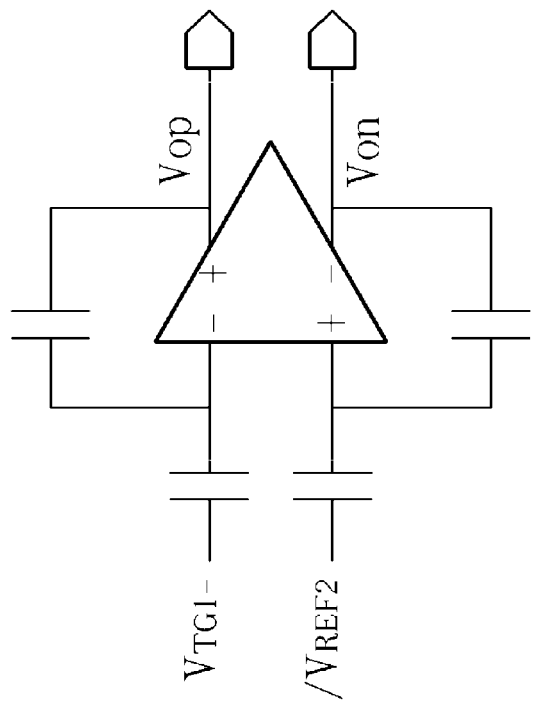
FIG. 3 (including 3A and 3B) is a diagram showing the sample and hold circuit shown in FIG. 1 during a sample period and during a hold period.
Figure 3:
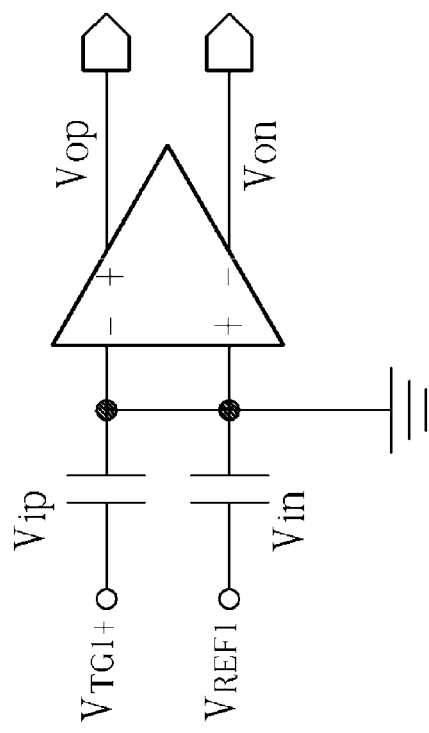

Please refer to FIG. 2 and FIG. 3. FIG. 2 (including 2A and 2B) is a diagram showing the traditional sample and hold circuit during the sample period and during the hold period, while FIG. 3 (including 3A and 3B) is a diagram showing the sample and hold circuit shown in FIG. 1 during the sample period and during the hold period. As shown in 2A, during the sample period, the voltage difference ($V_{ip}-V_{in}$) between the positive input terminal and the negative input terminal of the traditional sample and hold circuit is the voltage difference between the corresponding target positive voltage and the corresponding target negative voltage (i.e., $V_{TG1+}-V_{TG1-}$). As shown in 2B, during the hold period, the voltage difference ($V_{ip}-V_{in}$) between the positive input terminal and the negative input terminal of the traditional sample and hold circuit is zero. In other words, the signal sampled by the traditional sample and hold circuit during the sample period is ($V_{TG1+}-V_{TG1-}$); and the signal ($V_{op}-V_{on}$) outputted by the traditional sample and hold circuit during the hold period is the voltage difference ($V_{TG1+}-V_{TG1-}$) between the corresponding target positive voltage and the corresponding negative voltage, which can be known by the equation below:

$$V_{op} - V_{on} = (V_{TG1+} - V_{TG1-}) - 0 \qquad (2)$$
$$= (V_{TG1+} - V_{TG1-})$$

As shown in 3A, during the sample period, the voltage difference ($V_{ip}-V_{in}$) between the positive input terminal and the negative input terminal of the sample and hold circuit disclosed in the present invention is the voltage difference between the corresponding target positive voltage and the first reference voltage (i.e., $V_{TG1+}-V_{REF1}$). As shown in 3B, during the hold period, the voltage difference ($V_{ip}-V_{in}$) between the positive input terminal and the negative input terminal of the sample and hold circuit disclosed in the present invention is ($V_{TG1-}-V_{REF2}$). If the first reference voltage $V_{REF1}$ is equal to the second reference voltage $V_{REF2}$, the voltage difference between them is equal to ($V_{TG1-}-V_{REF1}$). In other words, the signal sampled by the sample and hold circuit disclosed in the present invention during the sample period is ($V_{TG1+}-V_{REF1}$), and the signal ($V_{op}-V_{on}$) outputted by the sample and hold circuit disclosed in the present invention during the hold period is the voltage difference ($V_{TG1+}-V_{TG1-}$) between the corresponding target positive voltage and the corresponding negative voltage, which can be known by the abovementioned equation (1) and is the same as the output signal obtained by the traditional sample and hold circuit shown in FIG. 2.

Figure 4:
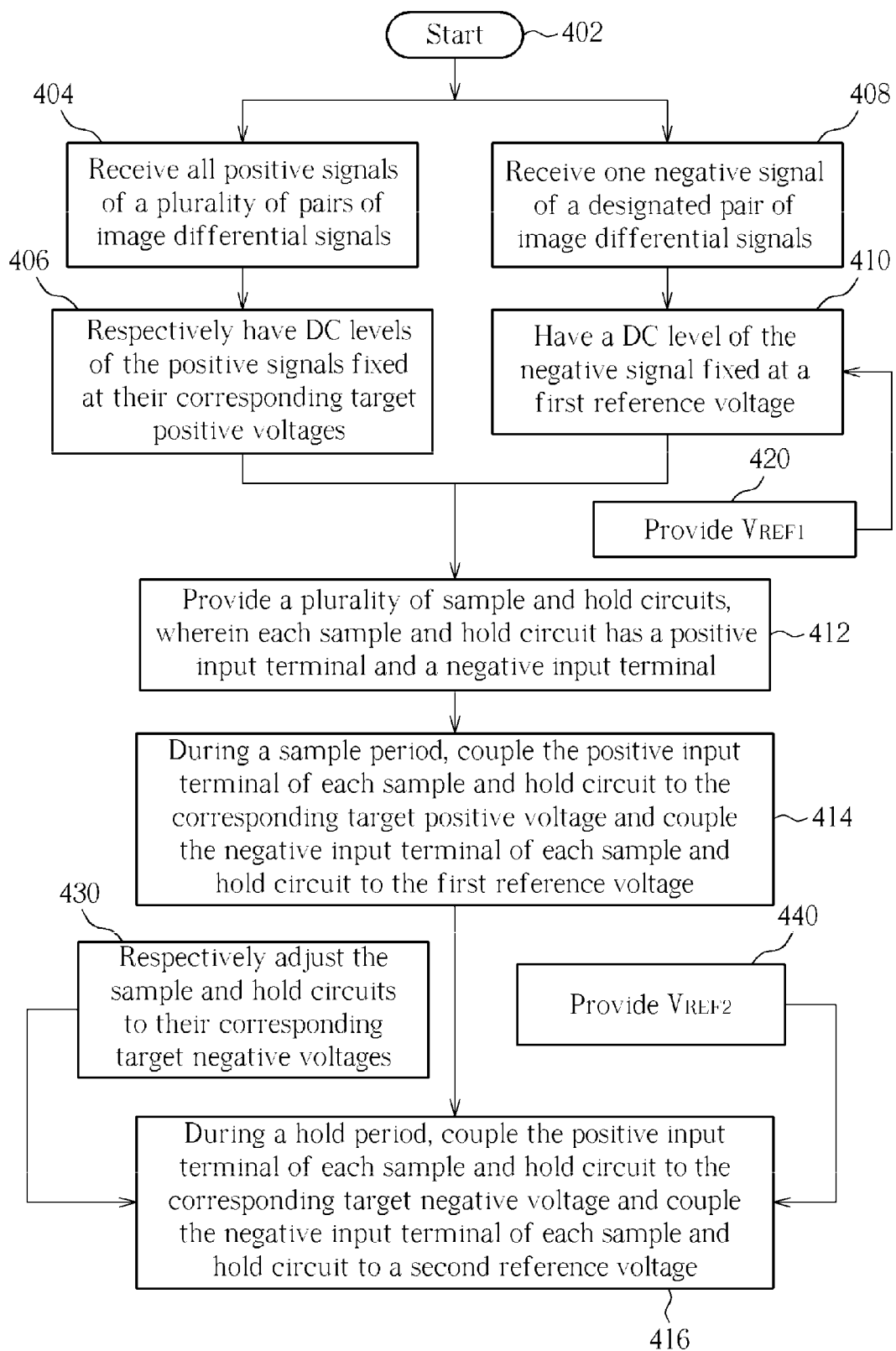
FIG. 4 is a flowchart illustrating a method for sharing pins of an analog front-end processing apparatus according to an exemplary embodiment of the present invention.

Please refer to FIG. 4. FIG. 4 is a flowchart illustrating a method for sharing pins of an analog front-end processing apparatus according to an exemplary embodiment of the present invention. Please note that the following steps are not limited to be performed according to the exact sequence shown in FIG. 4 if a roughly identical result can be obtained. The method includes the following steps:

Step 402: Start.

Step 404: Receive all positive signals of a plurality of pairs of image differential signals.

Step 406: Respectively have DC levels of the positive signals fixed at their corresponding target positive voltages.

Step 408: Receive one negative signal of a designated pair of the plurality of pairs of image differential signals.

Step 410: Have a DC level of the negative signal fixed at a first reference voltage.

Step 412: Provide a plurality of sample and hold circuits, wherein each sample and hold circuit has a positive input terminal and a negative input terminal.

Step 414: During a sample period, couple the positive input terminal of each sample and hold circuit to the corresponding target positive voltage and couple the negative input terminal of each sample and hold circuit to the first reference voltage.

Step 416: During a hold period, couple the positive input terminal of each sample and hold circuit to the corresponding target negative voltage and couple the negative input terminal of each sample and hold circuit to a second reference voltage.

Step 420: Provide the first reference voltage.

Step 430: Respectively adjust the plurality of sample and hold circuits to their corresponding target negative voltages.

Step 440: Provide the second reference voltage to the plurality of sample and hold circuits.

The following description details how each element operates by collocating the steps shown in FIG. 4 and the elements shown in FIG. 1. At first, the plurality of positive pins 122, 124, and 126 respectively receive the positive signals R+, G+, and B+ of the plurality of image differential signals (Step 404), and the negative pin 128 receives the negative signal R− of the designated pair of image differential signals (Step 408). The plurality of positive clamping circuits 132~136 respectively have the DC levels of the plurality of positive signals R+, G+, and B+ fixed at their corresponding target positive voltages $V_{TG1+}$, $V_{TG2+}$, and $V_{TG3+}$ (Step 406), and the negative clamping circuit 140 has the DC level of the negative signal R− fixed at the first reference voltage $V_{REF1}$ (Step 410). During the sample period, the positive input terminals 212~232 of the sample and hold circuits 210~230 are coupled to their corresponding target positive voltages $V_{TG1+}$, $V_{TG2+}$, and $V_{TG3+}$, and the negative input terminals 214~234 of the sample and hold circuits 210~230 are coupled to the first reference voltage $V_{REF1}$ (Step 414). During the hold period, the positive input terminals 212~232 of the sample and hold circuits 210~230 are coupled to their corresponding target negative voltages $V_{TG1-}$, $V_{TG2-}$, and $V_{TG3-}$, and the negative input terminals 214~234 of the sample and hold circuits 210~230 are coupled to the second reference voltage $V_{REF2}$ (Step 416). Furthermore, the first reference voltage $V_{REF1}$ and the second reference voltage $V_{REF2}$ are provided by the reference voltage circuit 190 (Steps 420 and 440). In addition, the plurality of sample and hold circuits 210~230 are adjusted to their corresponding target negative voltages $V_{TG1-}$, $V_{TG2-}$, and $V_{TG3-}$ by their corresponding adjusting circuits 182~186 (Step 430).

Please note that the steps of the abovementioned flowchart are merely an exemplary embodiment of the present invention, and in no way should be considered to be limitations of the scope of the present invention. The method can include other intermediate steps without departing from the spirit of the present invention.

The abovementioned embodiments are presented merely for describing the features of the present invention, and in no way should be considered to be limitations of the scope of the present invention. In summary, the present invention provides an analog front-end processing apparatus capable of sharing pins and a related method for sharing pins. By fixing the DC levels of all negative signals at the first reference voltage and by providing the first reference voltage (or the second reference voltage) to each sample and hold circuit for improvements, the signal finally outputted by the sample and hold circuit can still be maintained at the voltage difference between the corresponding target positive voltage and the corresponding target negative voltage (such as $V_{TG1+}-V_{TG1-}$). Therefore, the signal of the sample and hold circuit delivered to the next stage is the same as the original function, and each pair of image differential signals can tune its own DC level itself. If totally N pairs of image differential signals are included, only (N+1) pins (including N positive pins and one negative pin) are required in the analog front-end processing apparatus disclosed in the present invention, which achieves a goal of saving pin number and saving cost.

Those skilled in the art will readily observe that numerous modifications and alterations of the device and method may be made while retaining the teachings of the invention.

What is claimed is:

1. An analog front-end processing apparatus capable of sharing pins, for receiving all positive signals and one negative signal of a plurality of pairs of differential signals, the analog front-end processing apparatus comprising:
   a plurality of positive pins, respectively used for receiving the positive signals of the plurality of pairs of differential signals;
   a negative pin, for receiving the negative signal of a designated pair of the plurality of pairs of differential signals;
   a plurality of positive clamping circuits, respectively coupled to the plurality of positive pins, for having DC levels of the positive signals fixed at their corresponding target positive voltages;
   a negative clamping circuit, coupled to the negative pin, for having a DC level of the negative signal fixed at a first reference voltage;
   a plurality of sample and hold circuits, each sample and hold circuit having a positive input terminal and a negative input terminal, wherein a voltage difference between the two input terminals of each sample and hold circuit is substantially equal to a voltage difference between the corresponding target positive voltage and the first reference voltage during a sample period, and a voltage difference between the two input terminals of each sample and hold circuit is equal to a voltage difference between a corresponding target negative voltage and a second reference voltage during a hold period; and
   a plurality of adjusting circuits, respectively coupled to the plurality of sample and hold circuits, for respectively adjusting the plurality of sample and hold circuits to their corresponding target negative voltages.

2. The analog front-end processing apparatus of claim 1, wherein the first reference voltage is substantially different from the second reference voltage.

3. The analog front-end processing apparatus of claim 1, wherein the first reference voltage is substantially equal to the second reference voltage.

4. The analog front-end processing apparatus of claim 3, wherein the outputted signal of each sample and hold circuit during the hold period is a voltage difference between the corresponding target positive voltage and the corresponding target negative voltage.

5. The analog front-end processing apparatus of claim 1, further comprising:
   a reference voltage circuit, coupled to the negative clamping circuit and the plurality of sample and hold circuits, for providing the first reference voltage to the negative clamping circuit and for providing the second reference voltage to the plurality of sample and hold circuits.

6. The analog front-end processing apparatus of claim 1, wherein the plurality of pairs of differential signals comprise R, G, and B signals.

7. The analog front-end processing apparatus of claim 1, wherein the plurality of pairs of differential signals comprise Y, Pb, and Pr signals.

8. The analog front-end processing apparatus of claim 1, wherein the plurality of pairs of differential signals comprise a plurality of pairs of differential image signals of a display system.

9. A method for sharing pins of an analog front-end processing apparatus, the method comprising:
   receiving all positive signals of a plurality of pairs of differential signals;
   receiving one negative signal of a designated pair of the plurality of pairs of differential signals;
   respectively having DC levels of the positive signals fixed at their corresponding target positive voltages;
   having a DC level of the negative signal fixed at a first reference voltage;
   providing a plurality of sample and hold circuits, wherein each sample and hold circuit has a positive input terminal and a negative input terminal;
   during a sample period, coupling the positive input terminal of each sample and hold circuit to the corresponding target positive voltage, and coupling the negative input terminal of each sample and hold circuit to the first reference voltage;
   during a hold period, coupling the positive input terminal of each sample and hold circuit to the corresponding target negative voltage, and coupling the negative input terminal of each sample and hold circuit to a second reference voltage; and
   respectively adjusting the plurality of sample and hold circuits to their corresponding target negative voltages.

10. The method of claim 9, wherein the first reference voltage is substantially different from the second reference voltage.

11. The method of claim 9, wherein the first reference voltage is substantially equal to the second reference voltage.

12. The method of claim 11, further comprising:
   generating a sample signal during the sample period, wherein the sample signal is a voltage difference between the corresponding target positive voltage and the corresponding target negative voltage.

13. The method of claim 11, further comprising:
   providing the first reference voltage; and
   providing the second reference voltage to the plurality of sample and hold circuits.

14. The method of claim 9, wherein the plurality of pairs of differential signals comprises R, G, and B signals.

15. The method of claim 9, wherein the plurality of pairs of differential signals comprises Y, Pb, and Pr signals.

16. The method of claim 9, wherein the plurality of pairs of differential signals comprises a plurality of pairs of differential image signals of a display system.

* * * * *